United States Patent
Leobandung et al.

(10) Patent No.: US 9,812,323 B2
(45) Date of Patent: Nov. 7, 2017

(54) LOW EXTERNAL RESISTANCE CHANNELS IN III-V SEMICONDUCTOR DEVICES

(71) Applicant: International Business Machines Corporation, Armonk, NY (US)

(72) Inventors: Effendi Leobandung, Stormville, NY (US); Yanning Sun, Scarsdale, NY (US)

(73) Assignee: Internaitonal Business Machines Corporation, Armonk, NY (US)

( * ) Notice: Subject to any disclaimer, the term of this patent is extended or adjusted under 35 U.S.C. 154(b) by 0 days.

(21) Appl. No.: 14/479,504

(22) Filed: Sep. 8, 2014

(65) Prior Publication Data

US 2016/0071968 A1  Mar. 10, 2016

(51) Int. Cl.
*H01L 21/338* (2006.01)
*H01L 21/02* (2006.01)
*H01L 29/08* (2006.01)
*H01L 29/10* (2006.01)
*H01L 29/66* (2006.01)
*H01L 29/778* (2006.01)
*H01L 29/205* (2006.01)

(52) U.S. Cl.
CPC .... *H01L 21/02546* (2013.01); *H01L 29/0847* (2013.01); *H01L 29/1054* (2013.01); *H01L 29/66545* (2013.01); *H01L 29/7781* (2013.01); *H01L 29/205* (2013.01)

(58) Field of Classification Search
CPC ............ H01L 29/7787; H01L 29/0847; H01L 21/02546; H01L 21/02636; H01L 29/1054; H01L 21/22; H01L 21/3245; H01L 21/3065; H01L 29/66462; H01L 21/02543; H01L 29/205; H01L 29/7781; H01L 29/66545
See application file for complete search history.

(56) References Cited

U.S. PATENT DOCUMENTS

| | | |
|---|---|---|
| 5,321,278 A | 6/1994 | Nakagawa |
| 5,504,031 A | 4/1996 | Hsu et al. |
| 5,621,228 A | 4/1997 | Ando |
| 6,534,790 B2 | 3/2003 | Kato et al. |
| 7,682,887 B2 | 3/2010 | Dokumaci et al. |
| 7,692,213 B2 | 4/2010 | Teo et al. |
| 7,732,285 B2 | 6/2010 | Sell et al. |
| 7,902,009 B2 | 3/2011 | Simonelli et al. |
| 8,097,924 B2 | 1/2012 | Wang et al. |

(Continued)

FOREIGN PATENT DOCUMENTS

JP  8306909 A  11/1996

*Primary Examiner* — Phat X Cao
*Assistant Examiner* — Mohammad M Hoque
(74) *Attorney, Agent, or Firm* — Scully, Scott, Murphy & Presser, P.C.; Louis J. Percello, Esq.

(57) ABSTRACT

The present invention relates generally to semiconductor devices and more particularly, to a structure and method of forming a replacement channel composed of a III-V compound semiconductor material in a doped layer of a III-V compound semiconductor substrate. The replacement channel may be formed by removing a portion of the doped layer located directly below a dummy gate stack that has been removed. A III-V compound semiconductor material may be grown in the removed the portion to form the replacement channel and a gate stack may be formed on the replacement channel.

3 Claims, 8 Drawing Sheets

(56) References Cited

U.S. PATENT DOCUMENTS

| | | |
|---|---|---|
| 8,299,540 B2 | 10/2012 | Zhu et al. |
| 8,415,250 B2 | 4/2013 | Alptekin et al. |
| 8,421,120 B2 | 4/2013 | Bito |
| 8,815,690 B2* | 8/2014 | Cui .................. H01L 29/42312 257/366 |
| 9,184,289 B2* | 11/2015 | Huang ................ H01L 29/7848 |
| 2003/0001219 A1* | 1/2003 | Chau ................. H01L 29/41783 257/412 |
| 2006/0286729 A1* | 12/2006 | Kavalieros ........ H01L 21/28079 438/183 |
| 2009/0026553 A1* | 1/2009 | Bhuwalka ......... H01L 29/66356 257/402 |
| 2009/0283756 A1* | 11/2009 | Hellings ............ H01L 29/0843 257/24 |
| 2010/0038727 A1 | 2/2010 | Chakravarthi et al. |
| 2011/0147712 A1* | 6/2011 | Radosavljevic .. H01L 29/66462 257/24 |
| 2011/0147713 A1* | 6/2011 | Pillarisetty ........ H01L 29/66462 257/24 |
| 2012/0273798 A1* | 11/2012 | Alptekin ............. H01L 29/7833 257/77 |
| 2013/0093497 A1* | 4/2013 | Lee .................... H01L 29/78609 327/420 |
| 2013/0181301 A1* | 7/2013 | Witters ............. H01L 29/66477 257/408 |
| 2013/0302951 A1* | 11/2013 | Xiao ................. H01L 21/28273 438/158 |
| 2014/0035040 A1* | 2/2014 | Le Royer ............ H01L 29/7831 257/365 |
| 2014/0203243 A1* | 7/2014 | Xiao ................. H01L 29/66795 257/24 |
| 2015/0021662 A1* | 1/2015 | Basu ................. H01L 29/66462 257/192 |
| 2015/0255575 A1* | 9/2015 | Wang ..................... H01L 29/20 257/288 |

* cited by examiner

LOW EXTERNAL RESISTANCE CHANNELS IN III-V SEMICONDUCTOR DEVICES

BACKGROUND

The present invention relates generally to semiconductor devices and more particularly, to a structure and method of forming a high mobility channel after dummy gate removal in a III-V compound semiconductor-containing field-effect transistor (FET).

The term "III-V compound semiconductor" denotes a semiconductor material that includes at least one element from Group III of the Periodic Table of Elements and at least one element from Group V of the Periodic Table of Elements. Typically, each of the III-V compound semiconductor layers is a binary, ternary, or quaternary III-V containing compound. Examples of III-V compound semiconductors that can be used in the present invention include, but are not limited to, alloys of InGaAs, InAlAs, InAlAsSb, InAlAsP, and InGaAsP.

Compound III-V semiconductors may be desirable for use as channel materials for advanced ultra large scale integration (ULSI) digital logic applications due to their high electron hole mobility as compared to conventional silicon-based semiconductor devices. For example, InGaAs/InAlAs materials may be preferred in ULSI applications due to their large conduction-band offsets and high carrier mobility. Schottky-gated InGaAs high electron mobility transistors (III-V HEMTs) grown on InP substrates have produced maximum transconductance ($g_m$) values and have been shown to compare favorably in terms of a power-delay product.

SUMMARY

According to an embodiment, a method is disclosed. The method may include: removing a portion of a doped layer of a III-V compound semiconductor substrate, the portion located between gate spacers formed on the doped layer; forming a replacement channel in the portion, wherein the replacement channel may be composed of a III-V compound semiconductor material; and forming a gate stack on the replacement channel, wherein the gate stack may have a sidewall that is substantially planar with a sidewall of the replacement channel.

According to another embodiment, a method is disclosed. The method may include: forming a dummy gate dielectric on a doped layer of a III-V compound semiconductor substrate; forming a dummy gate on the dummy gate dielectric; forming a gate spacer on the doped layer, the gate spacer adjacent to and contacting a sidewall of the dummy gate dielectric and a sidewall of the dummy gate; forming a raised source-drain (RSD) region on the doped layer, the RSD region adjacent to and contacting a sidewall of the gate spacer; forming an insulator layer on the RSD region, the insulator layer contacting the sidewall of the gate spacer and the insulator layer having an upper surface that is substantially flush with an upper surface of the dummy gate; removing the dummy gate; removing the dummy gate dielectric; removing a portion of the doped layer to form a channel opening; forming a high mobility channel in the channel opening; and forming a gate on the high mobility channel, the gate having a sidewall that is contact with a sidewall of the spacer.

According to another embodiment, a structure is disclosed. The structure may include: a III-V compound semiconductor substrate; a replacement channel in a doped layer of the III-V compound semiconductor substrate; a gate stack on the replacement channel, the gate stack having a sidewall that is substantially flush with a sidewall of the replacement channel; a gate spacer on the doped layer, the gate spacer adjacent to and contacting the sidewall of the gate stack; a raised source-drain (RSD) region on the doped layer, the RSD region adjacent to and contacting the gate spacer; and an insulator layer on the RSD region, the insulator layer adjacent to and contacting the gate spacer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
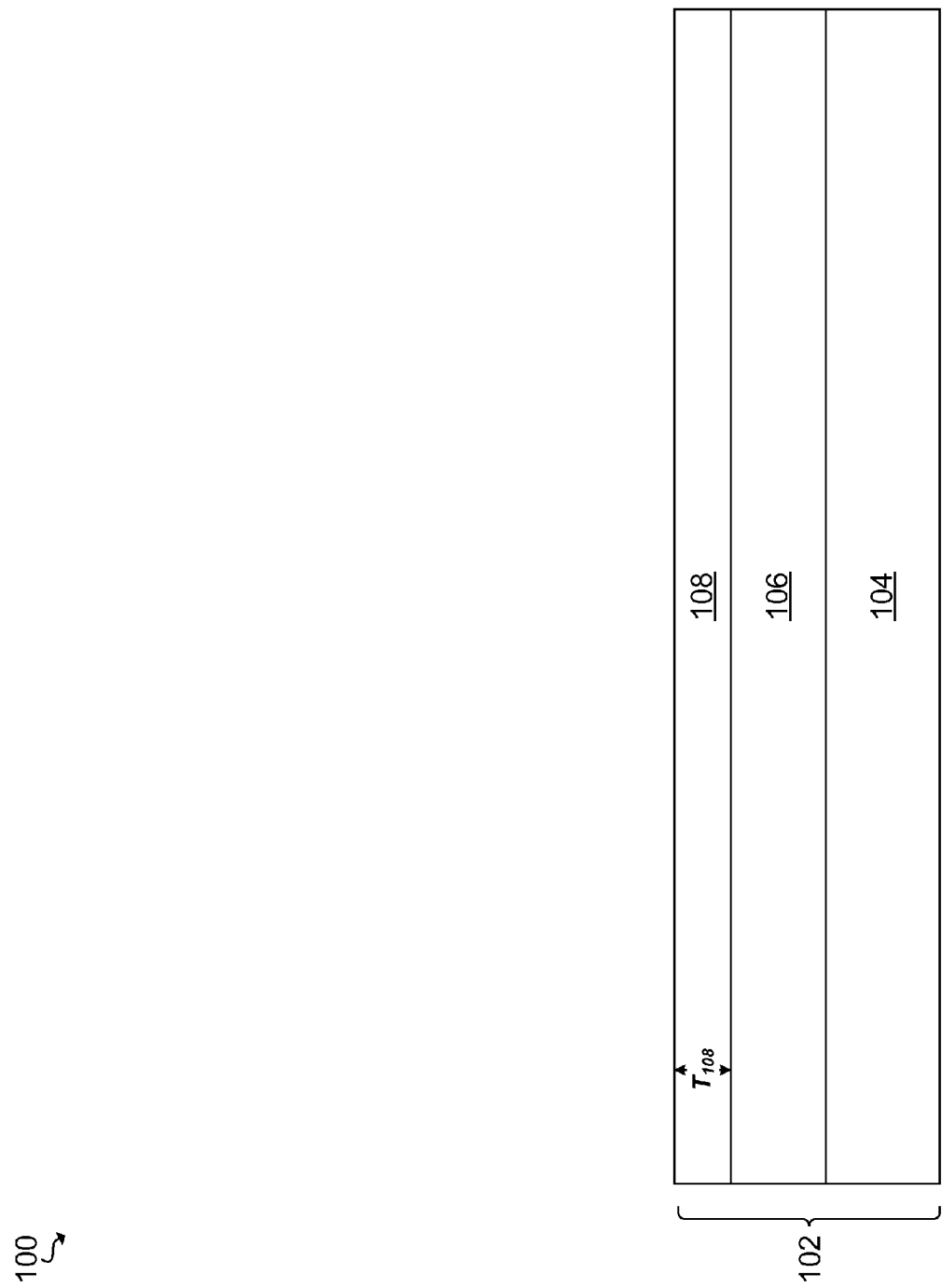
FIG. 1 is a cross section view illustrating a structure, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a high mobility channel after dummy gate removal in a III-V compound semiconductor-containing field-effect transistor (FET). Conventional III-V semiconductor devices tend to have channels with very low external resistance ($R_{ext}$) because there may be a continuous doped layer under gate stacks, spacers, and source-drain regions. However, this means that conventional III-V semiconductor devices are essentially counter doped devices (i.e., the channel region is doped with dopants having the same conductivity type as the source-drain regions) which lead to very poor short channel effects (SCE). Embodiments by which to form a high mobility channel in a III-V compound semiconductor device having a low $R_{ext}$ and improved SCE are described below with reference to FIGS. 1-8.

Referring now to FIG. 1, a cross section view of a structure 100 is shown. In an embodiment, the structure 100 may include a III-V compound semiconductor substrate 102. In another embodiment, the structure 100 may include a high-electron mobility transfer (HEMT) semiconductor substrate (not shown). The III-V compound semiconductor substrate 102 may include a substrate layer 104. The substrate layer 104 may include any semiconductor material including, for example, Si, SiGe, SiGeC, SiC, Ge, Ge alloys, Ga, GaAs, InAs, InP, GaP, GaN, and all other III-V compound semiconductors. The substrate layer 104 may be composed of a layered semiconductor material such as, for example, a semiconductor-on-insulator substrate. The substrate layer 104 may be doped, undoped, or contain doped and undoped regions therein. The substrate layer 104 may have a single crystal orientation or it may have surface regions that have different crystal orientation. The substrate layer 104 may be strained, unstrained, or a combination thereof.

A high band gap layer 106 may be formed on the substrate layer 104. The high band gap layer 106 may be composed of a III-V compound semiconductor material. In an embodiment, the high band gap layer 106 may be composed of an alloy of InAlAs and/or an alloy of InP. By "alloy of InAlAs" it is meant a composition of $In_xAl_{1-x}As$, wherein x is from approximately 0 to approximately 1, and more preferably from approximately 0.4 to approximately 0.6. The high band gap layer 106 may be a single crystal material of typical commercial quality. In an embodiment, the high band gap layer 106 may be formed using an epitaxial growth process such as, for example, molecular beam epitaxy (MBE) or metalorganic chemical vapor deposition (MOCVD). In another embodiment, the high band gap layer 106 may be epitaxially grown utilizing III-V containing precursors that are well known to those skilled in the art. In some embodiments, the high band gap layer 106 may be composed of a graded composition of one or more III-V compound semiconductor materials.

A doped layer 108 may be formed on the high band gap layer 106. The doped layer may be composed of a III-V compound semiconductor material. In an embodiment, the doped layer 108 may be composed of an alloy of InP. In another embodiment, the doped layer 108 may be composed of an alloy of InGaAs. By "alloy of InGaAs" it is meant a composition of $In_yGa_{1-y}As$ wherein y is from approximately 0 to approximately 1, and more preferably from approximately 0.3 to approximately 0.8. The doped layer 108 may be a single crystal material of typical commercial quality. In an embodiment, the doped layer 108 may be formed using an epitaxial growth process such as, for example, molecular beam epitaxy (MBE) or metalorganic chemical vapor deposition (MOCVD). In another embodiment, the doped layer 108 may be epitaxially grown utilizing III-V containing precursors that are well known to those skilled in the art. In some embodiments, the doped layer 108 may be composed of a graded composition of one or more III-V compound semiconductor materials. The doped layer 108 may have a thickness $T_{108}$ ranging from approximately 2 nm to approximately 20 nm.

The doped layer 108 may be doped with a dopant atom. In an embodiment, the dopant atom present in the doped layer 108 may be an n-type dopant (i.e., an element from Group IV or VI of the Periodic Table of Elements). In another embodiment, the dopant atom present in the doped layer 108 may be a p-type dopant (i.e., an element from Group II or IV of the Periodic Table of Elements). The concentration of dopant in the delta doped region 110 may be approximately $10^{17}$ atoms/cm$^3$ to approximately $10^{21}$ atoms/cm$^3$. The doped layer 108 may be doped using an in-situ doping during the formation of the doped layer 108, or alternatively, using an ion implantation process. After the dopant atoms are deposited, a conventional annealing process, such as rapid thermal annealing (RTA), may be performed to activate the dopants in the doped layer 108.

Figure 2:
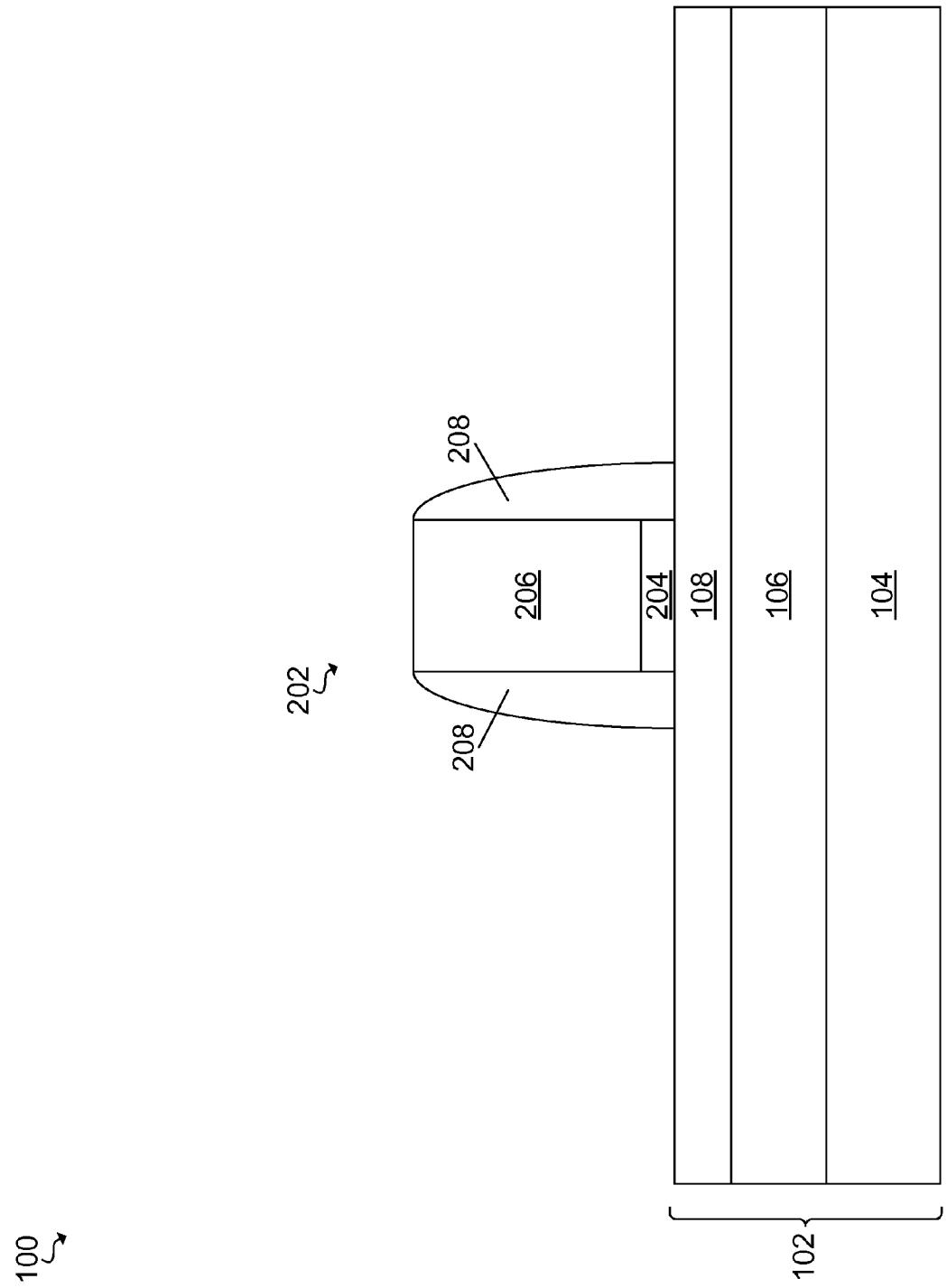
FIG. 2 is a cross section view illustrating forming a dummy gate stack on the doped layer, according to an embodiment of the present invention.

Referring now to FIG. 2, a cross section view illustrating forming a dummy gate stack 202 on the doped layer 108 is shown. In an embodiment, the dummy gate stack 202 may include a dummy gate 206 and a dummy gate dielectric 204 formed on the doped layer 108. The dummy gate dielectric 204 may be composed of a dielectric material, such as, for example SiO$_2$. In an embodiment, the dummy gate dielectric 204 may be composed of a high-k dielectric material. In an embodiment, the dummy gate 206 may be comprised of polycrystalline silicon.

The gate stack 202 may be formed by depositing a dummy gate dielectric layer (not shown) on the doped layer 108 and then depositing a dummy gate layer (not shown) thereon. The dummy dielectric layer and the dummy gate layer may be formed using a conventional deposition process, such as, for example, atomic layer deposition (ALD), chemical vapor deposition (CVD), plasma enhanced CVD (PECVD), physical vapor deposition (PVD), molecular beam deposition (MBD), pulsed laser deposition (PLD), liquid source misted chemical deposition (LSMCD), sputtering, or spin on deposition. After the dummy gate dielectric layer and the dummy gate layer are formed, a portion of each may be removed to form the dummy gate dielectric 204 and the dummy gate 206 respectively. The portion of the dummy gate dielectric layer and the portion of the dummy gate may be removed using a conventional etching technique, such as, for example, reactive ion etching (RIE).

The gate stack 202 may also include a first gate spacer and a second gate spacer 208 (hereinafter "gate spacers") formed on a sidewall of the dummy gate dielectric 204 and a sidewall of the dummy gate 206. The gate spacers 208 have a substantially planar bottom that is on the doped layer 108. The gate spacers 208 may be composed of an insulator, such as, for example, an oxide, a nitride, or an oxynitride. The gate spacers 208 may be formed by depositing a gate spacer layer (not shown) on the doped layer 108, the dummy gate dielectric 204, and the dummy gate 206, and then removing a portion of the gate spacer layer using a conventional etching technique, such as, for example, RIE.

Figure 3:
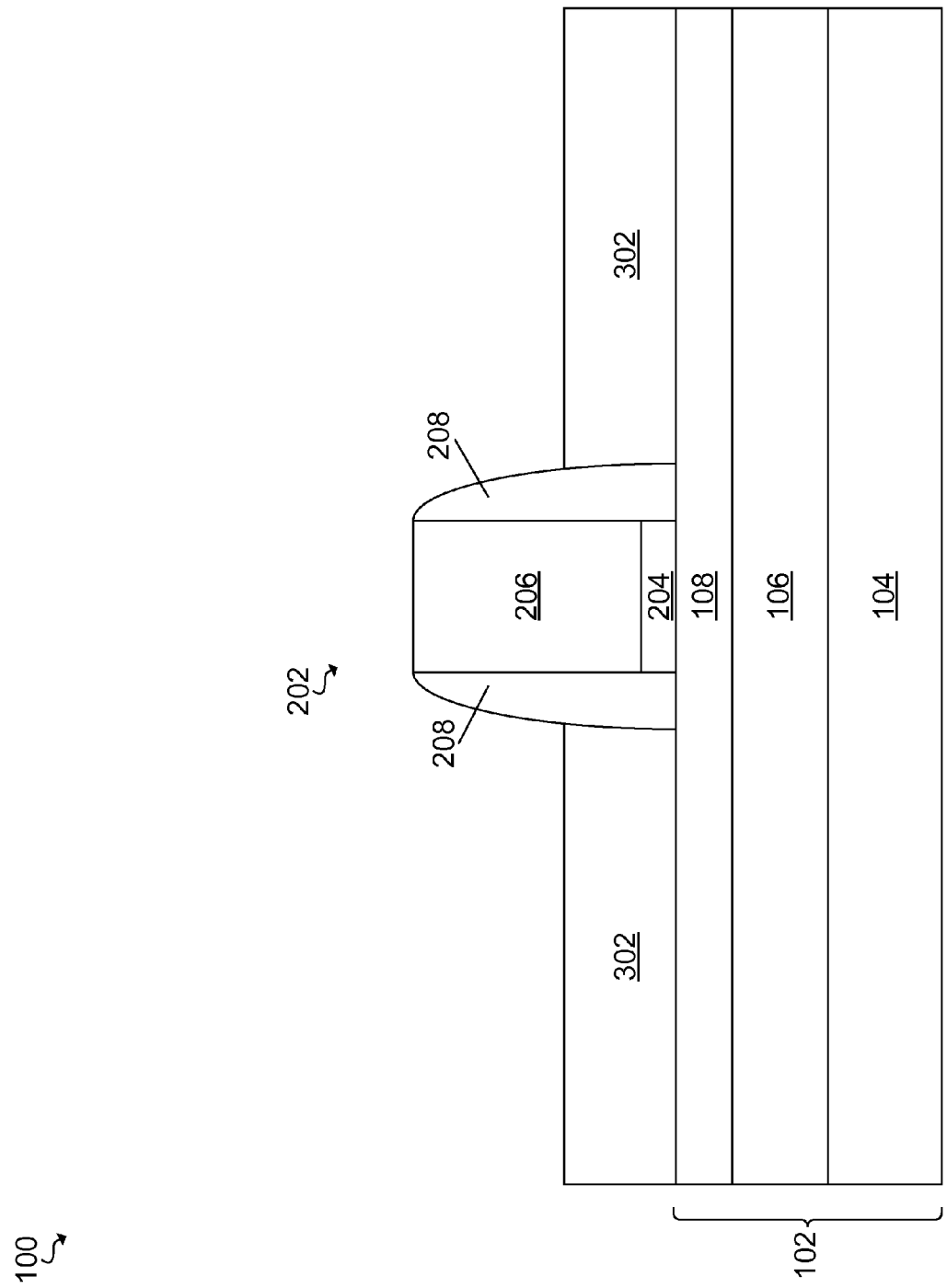
FIG. 3 is a cross section view illustrating forming one or more raised source-drain regions (hereinafter "RSD regions"), according to an embodiment of the present invention.

Referring now to FIG. 3, a cross section view illustrating forming one or more raised source-drain regions 302 (hereinafter "RSD regions") is shown. The RSD regions 302 may be formed by an epitaxial growth and doping process. In an embodiment, the RSD regions 302 may be formed by the epitaxial growth of a III-V compound semiconductor material, such as, for example, InP, or InGaAs. In another embodiment, the RSD regions 302 may be formed by the epitaxial growth of silicon, germanium, or a combination thereof.

In an embodiment in which the doped layer 108 is doped with p-type dopants for a PFET device, the RSD regions 302 may be in-situ doped with a matching p-type conductivity dopant during the selective epitaxial growth process. In another embodiment, the p-type conductivity dopant may be introduced to the RSD regions 302 using ion implantation following the epitaxial growth process. P-type semiconductor devices (PFETs) in III-V materials are typically produced by doping the source-drain regions with a p-type dopant composed of elements from: group II of the Periodic Table of Elements, including beryllium, zinc, or magnesium, that replace a group III atom; or group IV of the Periodic Table of Elements, including carbon, that replace a group V atom. In an embodiment, the RSD regions 302 may have a p-type dopant in a concentration ranging from approximately $1 \times 10^{19}$ atoms/cm$^3$ to approximately $5 \times 10^{21}$ atoms/cm$^3$.

In an embodiment in which the doped layer 108 is doped with n-type dopants for a NFET device, the RSD regions 302 may be in-situ doped with a matching n-type conductivity dopant during the selective epitaxial growth process. In another embodiment, the n-type conductivity dopant may be introduced to the RSD regions 302 using ion implantation following the epitaxial growth process. N-type semiconductor devices (NFETs) in III-V materials are typically produced by doping the source-drain regions with a n-type dopant composed of elements from: group IV of the Periodic Table of Elements, including silicon or germanium, that replace a group III atom; or group VI of the Periodic Table of Elements, including sulfur, selenium, or tellurium, that replace a group V atom. In an embodiment, the RSD regions 302 may have a n-type dopant in a concentration ranging from approximately $1 \times 10^{19}$ atoms/cm$^3$ to approximately $5 \times 10^{21}$ atoms/cm$^3$. After the dopant atoms are formed, a conventional annealing process, such as RTA, may be performed to activate the dopants in the RSD regions 302.

Figure 4:
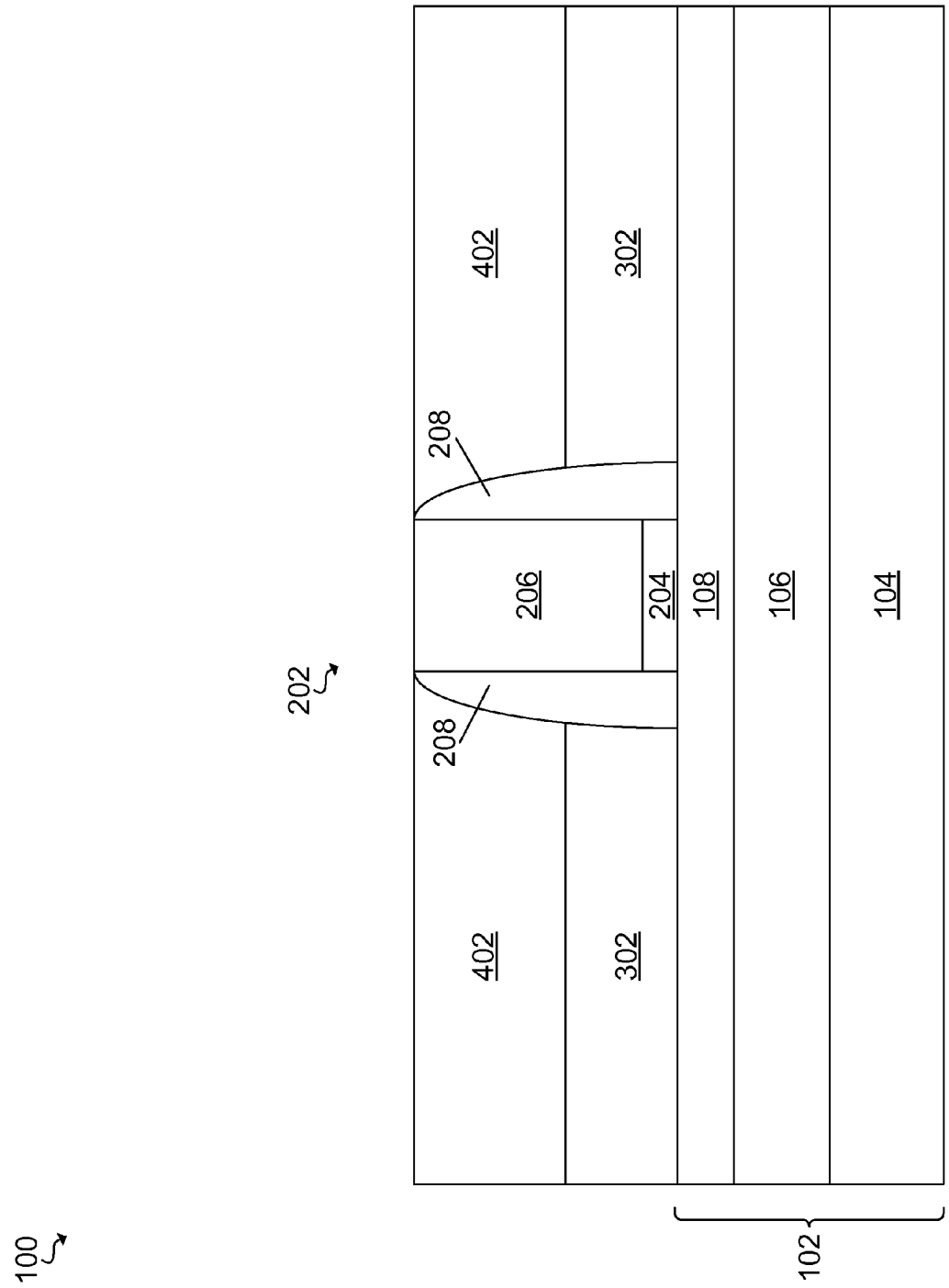
FIG. 4 is a cross section view illustrating forming an insulator layer on the RSD regions, according to an embodiment of the present invention.

Referring now to FIG. 4, a cross section view illustrating forming an insulator layer 402 on the RSD regions 302 is shown. The insulator layer 402 may be composed of an electrically insulating material. In an embodiment, the insulator layer 402 may be composed of a dielectric material, such as, for example, an oxide, a nitride, or an oxynitride. In another embodiment, the insulator layer 402 may be composed of a glass, such as, for example, borosilicate glass. The insulator layer 402 may be formed by depositing the electrically insulating material on the RSD regions 302 and the dummy gate stack 202 using a conventional deposition process, such as, for example ALD, CVD, PECVD, PVD, MBD, PLD, LSMCD, sputtering, or spin on deposition. In an embodiment, a portion of the electrically insulating material may be removed so that an upper surface of the insulator layer 402 is substantially flush with an upper surface of the gate stack 202. The portion of the electrically insulating material may be removed using a selective process, such as etching, or using a nonselective process, such as chemical mechanical planarization (CMP).

Figure 5:
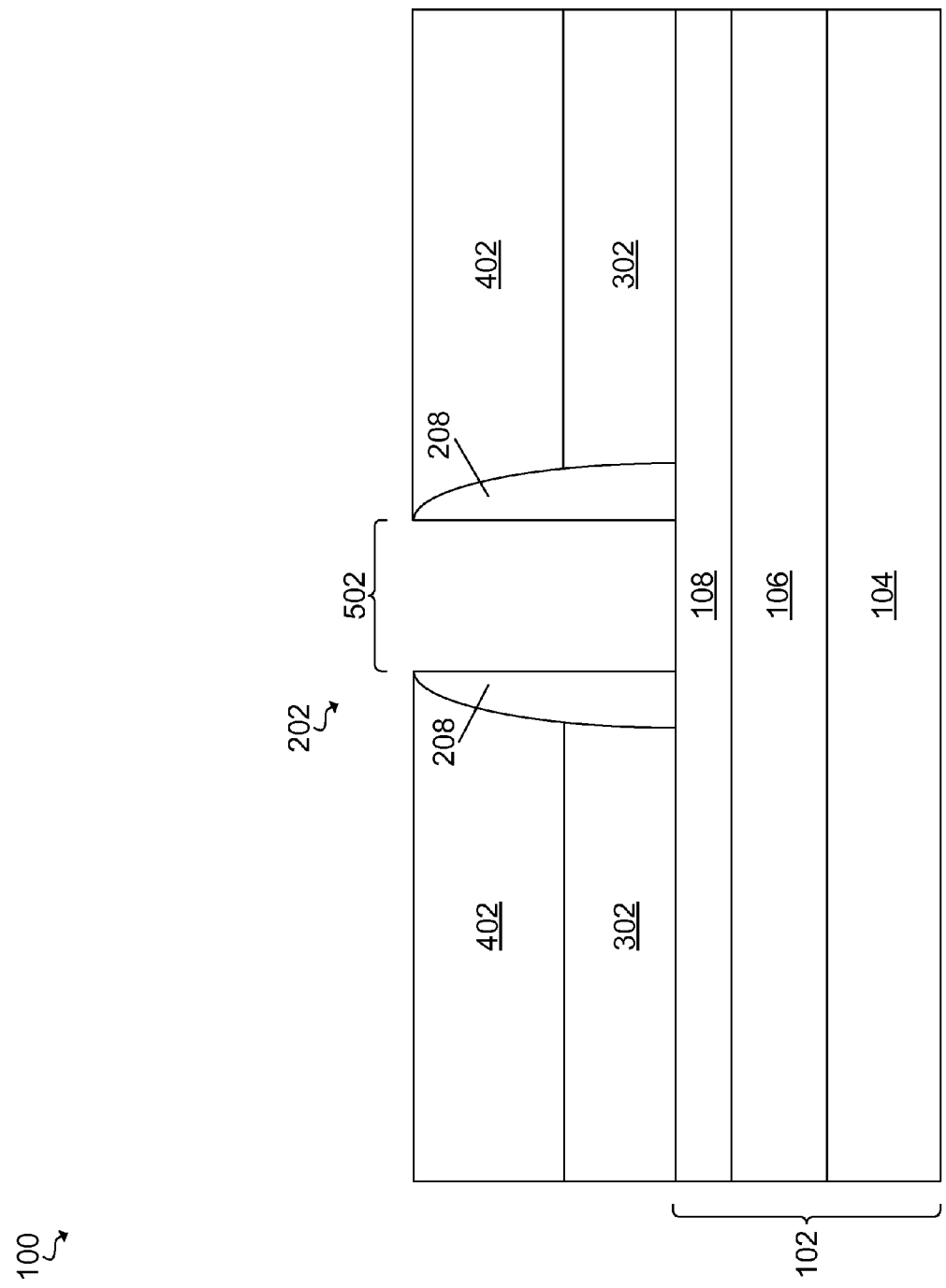
FIG. 5 is a cross section view illustrating removing a dummy gate and a dummy gate dielectric 204 to form a gate opening, according to an embodiment of the present invention.

Referring now to FIG. 5, a cross section view illustrating removing the dummy gate 206 (FIG. 4) and the dummy gate dielectric 204 (FIG. 4) to form a gate opening 502 is shown. The dummy gate 206 and the dummy gate dielectric 204 may be removed, selective to the insulator layer 402, the gate spacers 208, and the doped layer 108, using a conventional etching technique, such as, for example, RIE. The removal process may form the gate opening 502, which may be defined laterally by the gate spacers 208 and vertically by an upper surface of the doped layer 108 on the bottom and an upper surface of the gate spacers 208 on the top.

Figure 6:
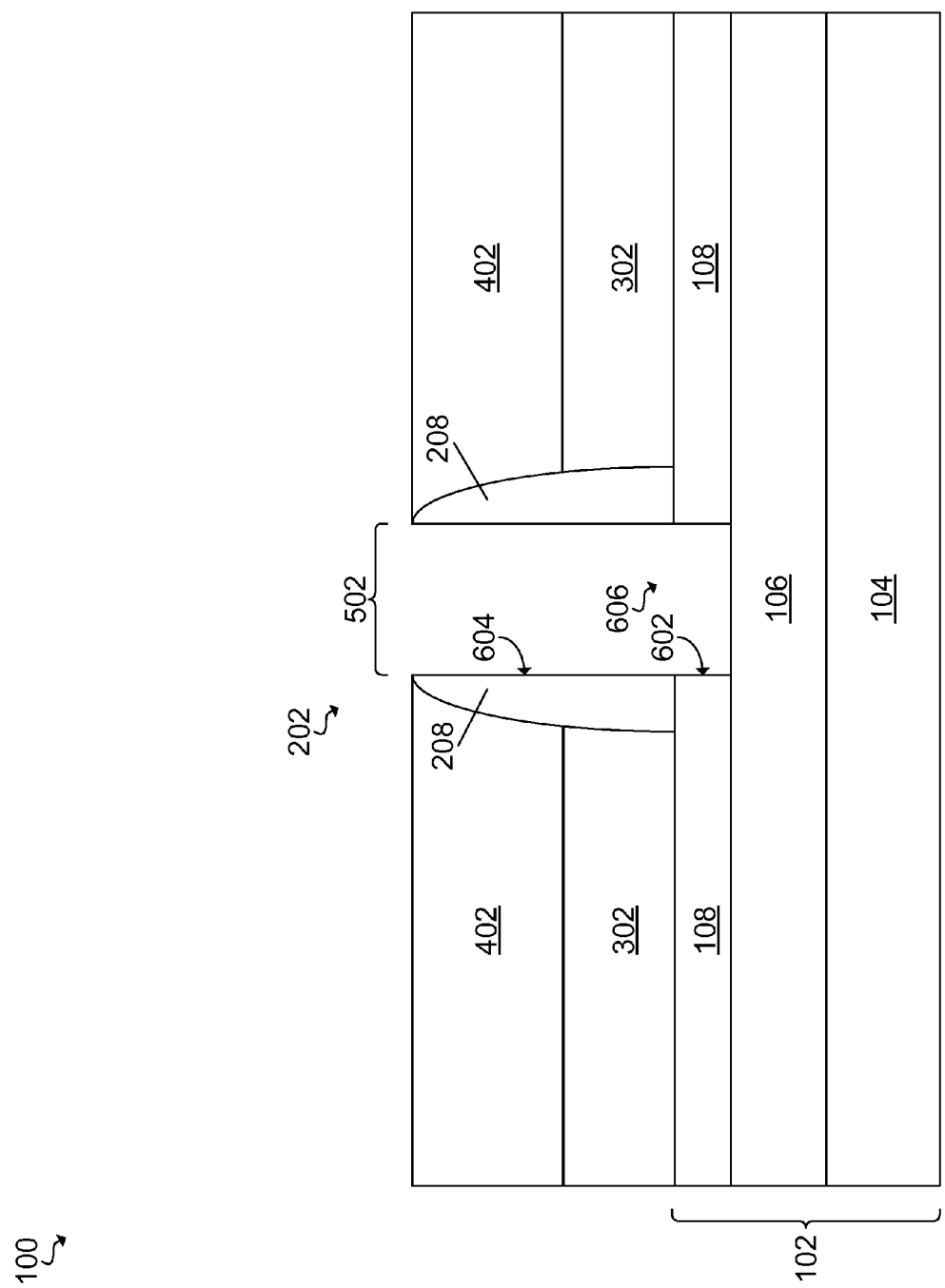
FIG. 6 is a cross section view illustrating removing a portion of the doped layer below the gate opening to form a channel opening, according to an embodiment of the present invention.

Referring now to FIG. 6, a cross section view illustrating removing a portion of the doped layer 108 below the gate opening 502 to form a channel opening 606 is shown. The portion of the doped layer 108 may be removed, selective to the insulator layer 402, the gate spacers 208, and the high band gap layer 106, using a conventional etching technique, such as, for example, RIE. In an embodiment, an entire thickness of the doped layer 108 may be removed, such that an upper surface of the high band gap layer 106 may be exposed. In an embodiment, the portion of the doped layer 108 below the gate opening 502 may be removed directionally, such that the channel opening 606 may have sidewalls 602 that are substantially flush with sidewalls 604 of the gate spacers 208.

Figure 7:
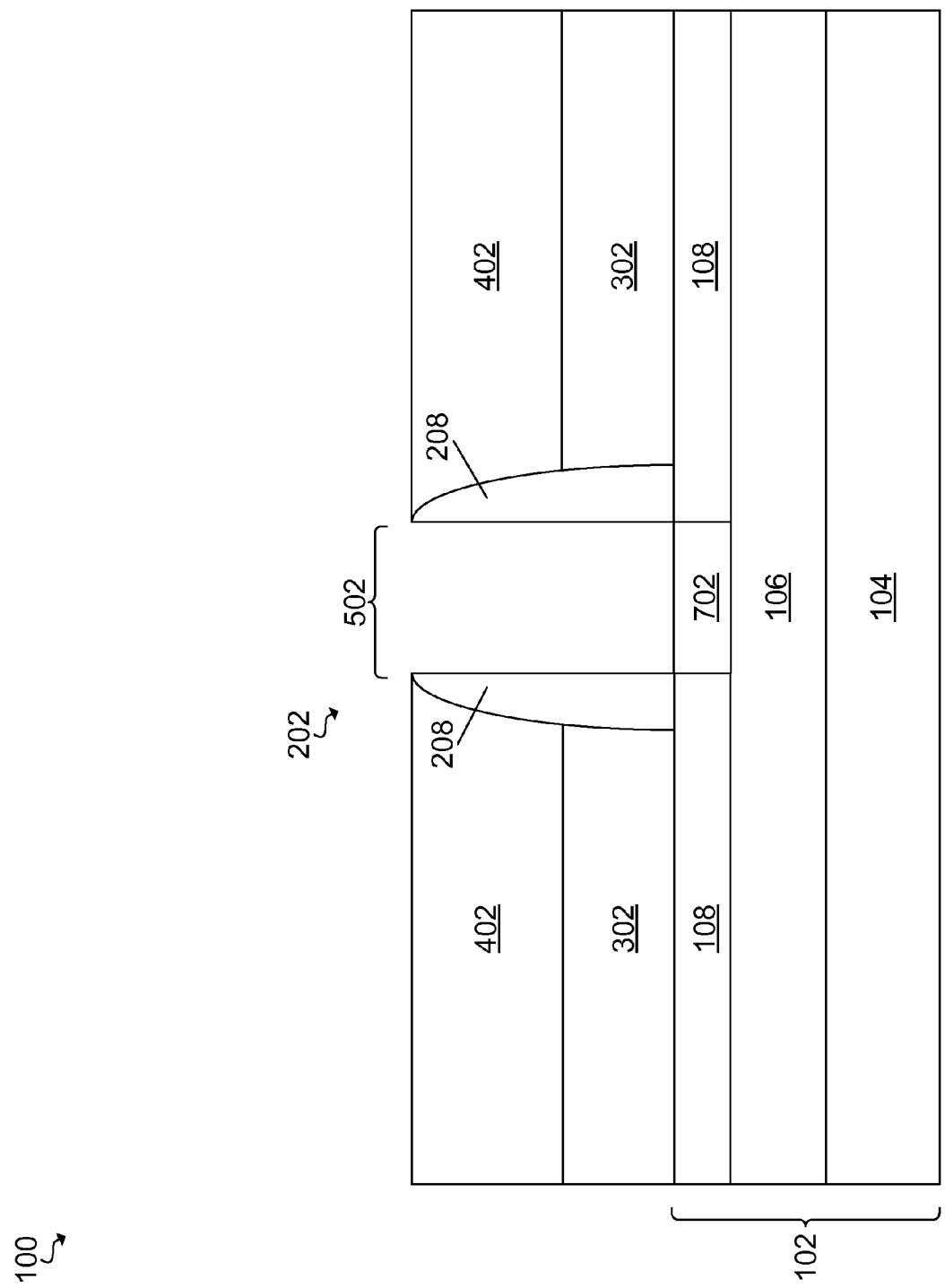
FIG. 7 is a cross section view illustrating forming a high mobility channel in the channel opening, according to an embodiment of the present invention.

Referring now to FIG. 7, a cross section view illustrating forming a replacement channel, or high mobility channel 702, in the channel opening 606 (FIG. 6) is shown. The high mobility channel 702 may be composed of a III-V compound semiconductor material. In an embodiment, the doped layer 108 may be composed of an alloy InP. In another embodiment, the high mobility channel 702 may be composed of an alloy of InGaAs. By "alloy of InGaAs" it is meant a composition of $In_yGa_{1-y}As$ wherein y is from approximately 0 to approximately 1, and more preferably from approximately 0.3 to approximately 0.8. The high mobility channel 702 may be a single crystal material of typical commercial quality. In an embodiment, the high mobility channel 702 may be formed using an epitaxial growth process such as, for example, MBE or MOCVD. In another embodiment, the high mobility channel 702 may be epitaxially grown utilizing III-V containing precursors that are well known to those skilled in the art. In some embodiments, the high mobility channel 702 may be composed of a graded composition of one or more III-V compound semiconductor materials. The high mobility channel 702 may have a width that is substantially similar to a width of the gate opening 502.

In an embodiment, the high mobility channel 702 may be left undoped. However, in another embodiment, the high mobility channel 702 may be doped with a dopant atom of an opposite type than the dopant atom present in the doped layer 108. In an embodiment, the dopant atom present in the high mobility channel 702 may be a n-type dopant (i.e., an element from Group IV or VI of the Periodic Table of Elements). In another embodiment, the dopant atom present in the high mobility channel 702 may be a p-type dopant (i.e., an element from Group II or IV of the Periodic Table of Elements). In another embodiment, the high mobility channel 702 may be doped with a dopant type that matches the doped layer 108.

In an embodiment in which the doped layer 108 is doped with n-type dopants, the high mobility channel 702 may be in-situ doped with a p-type conductivity dopant during the selective epitaxial growth process. In another embodiment, the p-type conductivity dopant may be introduced to the high mobility channel 702 using ion implantation following the epitaxial growth process. The high mobility channel 702 may be doped with a p-type dopant composed of elements from: group II of the Periodic Table of Elements, including beryllium or magnesium, that replace a group III atom; or group IV of the Periodic Table of Elements, including carbon, that replace a group V atom. In an embodiment, the high mobility channel 702 may have a p-type dopant in a concentration ranging from approximately $\times 10^{17}$ atoms/cm$^3$ to approximately $5 \times 10^{21}$ atoms/cm$^3$. In another embodiment, the p-type conductivity dopant may be introduced to the high mobility channel 702 using ion implantation following the epitaxial growth process.

In an embodiment in which the doped layer 108 is doped with p-type dopants, the high mobility channel 702 may be in-situ doped with an n-type conductivity dopant during the selective epitaxial growth process. In another embodiment, the n-type conductivity dopant may be introduced to the high mobility channel 702 using ion implantation following the epitaxial growth process. The high mobility channel 702 may be doped with a n-type dopant composed of elements from: group IV of the Periodic Table of Elements, including silicon or germanium, that replace a group III atom; or group VI of the Periodic Table of Elements, including sulfur, selenium, or tellurium, that replace a group V atom. In an embodiment, the high mobility channel 702 may have a n-type dopant in a concentration ranging from approximately $1 \times 10^{17}$ atoms/cm$^3$ to approximately $5 \times 10^{21}$ atoms/cm$^3$.

In an embodiment, a conventional annealing process, such as RTA, may be performed to after the high mobility channel 702 is deposited. The annealing process may activate the dopants in the high mobility channel 702. In addition, the annealing process may cause some of the dopants from the doped layer 108 to diffuse into the high mobility channel 702. This diffusion may reduce the electrical resistance in the high mobility channel 702. The highly doped regions of the doped layer 108 below the gate spacers 208 and the short width of the high mobility channel 702 may provide a FET device with a low $R_{ext}$ and a short high mobility channel 702 with desirable SCE.

Figure 8:
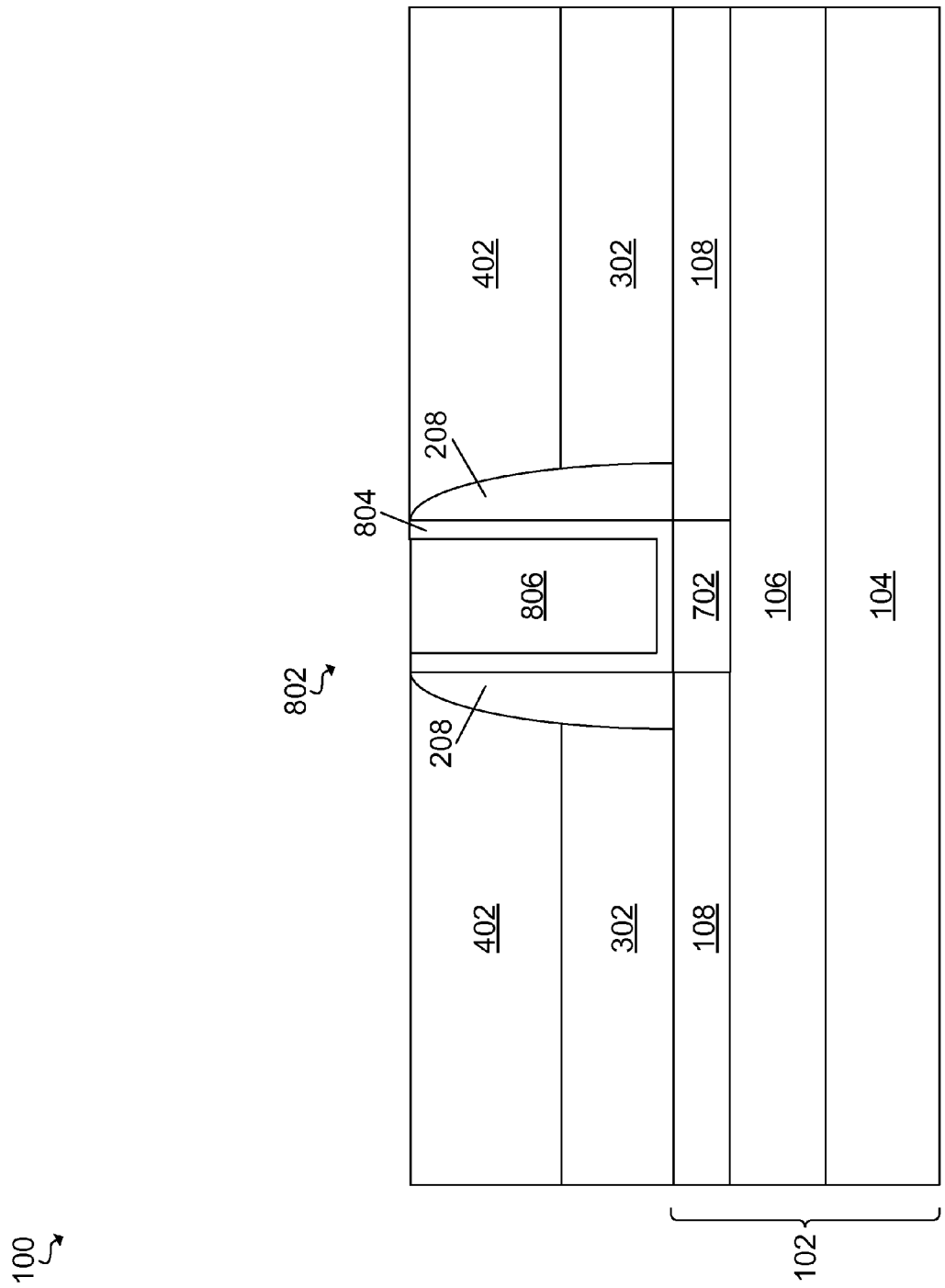
FIG. 8 is a cross section view illustrating forming a gate stack, according to an embodiment of the present invention.

Referring now to FIG. 8, a cross section view illustrating forming a gate stack 802 is shown. The gate stack 802 may be formed by depositing a gate dielectric 804 and a gate conductor 806 in the gate opening 502 (FIG. 7). The gate dielectric 804 may be composed of a high-k dielectric material (i.e., a dielectric material having a dielectric constant of greater than approximately 4.0). In an embodiment, the gate dielectric 804 may be composed of a high-k dielectric material including, but not limited to: an oxide, nitride, oxynitride and/or silicates including metal silicates, aluminates, titanates, and nitrides. In an embodiment, the gate dielectric layer 804 may be composed of $HfO_2$, $ZrO_2$, $Al2O_3$, $TiO_2$, $La_2O_3$, $SrTiO_3$, $LaAlO_3$, $Y_2O_3$, a pervoskite oxide, $HfSiO_z$, $HfAlO_z$, or $HfAlO_aN_b$. The gate dielectric 804 may be formed on the high mobility gate 702 and the sidewalls 604 (FIG. 6) of the gate spacers 208. The gate dielectric 804 may be formed utilizing a conventional deposition process including, but not limited to, MBE, CVD, PECVD, ALD, evaporation, PVD, chemical solution deposition, sputtering, spin on deposition, and other like deposition processes.

The gate conductor 806 may be composed of any conductive material used in the art to form a gate. In an embodiment the gate conductor 806 may be composed of a conductive material such as, for example: metal, doped polysilicon, doped polysilicon germanium, conductive silicides, conductive nitrides, and combinations or multilayers thereof. Illustrative examples of dopant ions include As, P, B, Sb, Bi, Al, Ga, Ti, or mixtures thereof. In another embodiment, the gate conductor 806 may be composed of a conductive metal such as Al, Pt, Au, W, and Ti. The gate conductor 504B may be formed on the gate dielectric 804. The gate conductor 806 may be formed by a conventional deposition process such as, for example, ALD, CVD, PECVD, PVD, plating, thermal or ebeam evaporation, spin on depiction, sputtering, and other like processes.

In an embodiment, after the gate dielectric 804 and the gate conductor 806 are deposited, they may be planarized using a conventional process such as, for example, CMP, so that an upper surface of the gate stack 802 is substantially flush with a upper surface of the insulator layer 402.

As described above, embodiments of the present invention allow for the formation of a high mobility channel, having a low $R_{ext}$ and improved SCE, in a III-V compound semiconductor device using a dummy gate replacement process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a III-V compound semiconductor substrate comprising a substrate layer, a further III-V compound semiconductor material layer on top a surface of said substrate layer, and a doped III-V compound semiconductor material layer on top a surface of said further III-V compound semiconductor material layer, said doped III-V compound semiconductor material layer having a first conductivity type dopant;
   a III-V compound semiconductor material replacement channel formed in the doped III-V compound semiconductor material layer of the III-V compound semiconductor substrate, said replacement channel extending for a length defined by first and second sidewalls, and a top surface and a bottom surface of the III-V compound semiconductor material replacement channel is co-planar with a respective top surface and a bottom surface of the doped III-V compound semiconductor material layer, said replacement channel having a second conductivity type dopant opposite said first conductivity type;
a gate stack on a surface of the replacement channel, the gate stack having respective first and second sidewalls that is each substantially in alignment with a respective first and second sidewall of the replacement channel;
a gate spacer on the doped III-V compound semiconductor material layer, the gate spacer having respective first inner and second inner sidewall surfaces adjacent to and contacting the respective first and second sidewall of the gate stack wherein a first inner sidewall surface and second inner sidewall surface of the gate spacer is aligned with said defined first and second sidewalls of said replacement channel;
a raised source-drain (RSD) region on the doped layer, the RSD region adjacent to and contacting the gate spacer; and
an insulator layer on the RSD region, the insulator layer adjacent to and contacting the gate spacer.

2. The structure of claim 1, wherein the substrate layer comprises Ge, Ga, GaAs, InAs, InP, GaP, or GaN; the further III-V compound semiconductor material layer comprises InP or InAlAs; and the doped III-V compound semiconductor material layer comprises InP or InGaAs doped with the first conductivity type dopant.

3. The structure of claim 1, wherein the III-V compound semiconductor material replacement channel comprises InP or InGaAs.

* * * * *